United States Patent
Michaud et al.

(10) Patent No.: US 9,646,721 B1
(45) Date of Patent: May 9, 2017

(54) SOLID STATE DRIVE BAD BLOCK MANAGEMENT

(71) Applicant: EMC Corporation, Hopkinton, MA (US)

(72) Inventors: Adrian Michaud, Carlisle, MA (US); Dragan Savic, Brookline, MA (US); Patrick J. Weiler, Northboro, MA (US); Amnon Izhar, Brookline, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/087,000

(22) Filed: Mar. 31, 2016

(51) Int. Cl.
*G11C 16/06* (2006.01)
*G11C 29/00* (2006.01)
*G11C 16/20* (2006.01)

(52) U.S. Cl.
CPC .............. *G11C 29/76* (2013.01); *G11C 16/20* (2013.01)

(58) Field of Classification Search
CPC ...................................... G11C 16/06
USPC ....................... 365/185.01–185.33
See application file for complete search history.

(56) References Cited

U.S. PATENT DOCUMENTS

| | | | | |
|---|---|---|---|---|
| 8,599,609 B2* | 12/2013 | Franca-Neto | ....... | G06F 11/1048 365/185.02 |
| 8,649,215 B2* | 2/2014 | Franca-Neto | ...... | G11C 16/3495 365/185.02 |
| 2010/0246260 A1* | 9/2010 | Kang | ................. | G11C 11/5621 365/185.03 |
| 2012/0044762 A1* | 2/2012 | Rotbard | ................. | G11C 11/56 365/185.03 |
| 2013/0070526 A1* | 3/2013 | Eun | ........................ | G11C 16/26 365/185.03 |
| 2013/0194864 A1* | 8/2013 | Bandic | ................ | G11C 11/5678 365/185.03 |
| 2013/0194865 A1* | 8/2013 | Bandic | ............... | G11C 13/0035 365/185.03 |
| 2014/0219019 A1* | 8/2014 | Hsieh | ..................... | G11C 16/14 365/185.03 |
| 2014/0269053 A1* | 9/2014 | Chen | ........................ | G11C 7/24 365/185.03 |
| 2014/0269056 A1* | 9/2014 | Chang | .................... | G11C 16/10 365/185.03 |

* cited by examiner

Primary Examiner — Harry W Byrne
(74) Attorney, Agent, or Firm — Krishnendu Gupta; Konrad R. Lee

(57) ABSTRACT

A system, computer program product, and computer-executable method of managing a solid state drive (SSD) in a data storage system, the system, computer program product, and computer-executable method including initializing the SSD to enable the SSD to request memory for bad block replacement, querying the SSD to determine a size of memory on the SSD reserved for dynamic over provisioning, and allocating a portion of the size of memory for bad block replacement.

5 Claims, 12 Drawing Sheets

SOLID STATE DRIVE BAD BLOCK MANAGEMENT

A portion of the disclosure of this patent document may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This invention relates to data storage.

BACKGROUND

Computer systems are constantly improving in terms of speed, reliability, and processing capability. As is known in the art, computer systems which process and store large amounts of data typically include a one or more processors in communication with a shared data storage system in which the data is stored. The data storage system may include one or more storage devices, usually of a fairly robust nature and useful for storage spanning various temporal requirements, e.g., disk drives. The one or more processors perform their respective operations using the storage system. Mass storage systems (MSS) typically include an array of a plurality of disks with on-board intelligent and communications electronics and software for making the data on the disks available.

Companies that sell data storage systems are very concerned with providing customers with an efficient data storage solution that minimizes cost while meeting customer data storage needs. It would be beneficial for such companies to have a way for reducing the complexity of implementing data storage.

SUMMARY

A system, computer program product, and computer-executable method of managing a solid state drive (SSD) in a data storage system, the system, computer program product, and computer-executable method including initializing the SSD to enable the SSD to request memory for bad block replacement, querying the SSD to determine a size of memory on the SSD reserved for dynamic over provisioning, and allocating a portion of the size of memory for bad block replacement.

BRIEF DESCRIPTION OF THE DRAWINGS

Objects, features, and advantages of embodiments disclosed herein may be better understood by referring to the following description in conjunction with the accompanying drawings. The drawings are not meant to limit the scope of the claims included herewith. For clarity, not every element may be labeled in every figure. The drawings are not necessarily to scale, emphasis instead being placed upon illustrating embodiments, principles, and concepts. Thus, features and advantages of the present disclosure will become more apparent from the following detailed description of exemplary embodiments thereof taken in conjunction with the accompanying drawings in which:

Like reference symbols in the various drawings indicate like elements.

DETAILED DESCRIPTION

Figure 1:
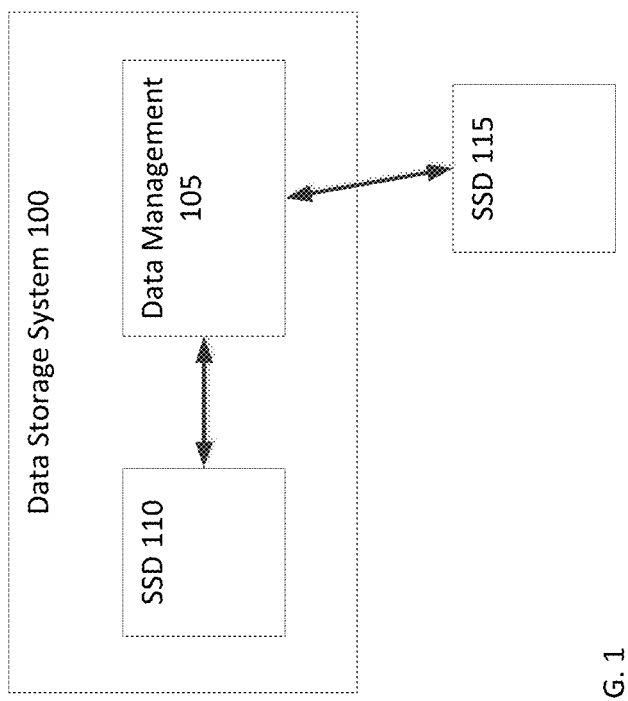
FIG. 1 is a simplified illustration of a data storage system utilizing solid state drives for data storage, in accordance with an embodiment of the present disclosure.

Traditionally, NAND memory chips used in a Solid State Drive (SSD) are shipped from a NAND manufacturer with known defective blocks. Generally, SSD Manufacturers are responsible for initially mapping out these bad blocks (BB) as part of a SSD low level formatting process to ensure the NAND memory devices can reliably store data to the remaining good blocks on a SSD. Conventionally, after the initial formatting, the SSD Flash translation layer (FTL) is responsible for replacing any newly discovered BBs with a new block from a fixed-size pool of spares. Typically, once the replacement block pool runs out of good blacks, a SSD can no longer reliably write data or manage data retention. Traditionally, at this point, a SSD may be marked failed by a host and may transition to a read-only device. Conventionally, improvements to management of NAND memory chips in SSDs would be beneficial to the data storage industry.

Typically, bad block management (BBM), on an SSD, marks a given NAND block as bad if one or more pages inside the block contain more bit errors than the SSD Error Correction Code (ECC) can correct. Traditionally, there are two cases when the ECC fails on the SSD. Conventionally, when NAND erasing, programming, or reading becomes unreliable, i.e. a bit error rate (BER) becomes too high to be handled by the implemented ECC. Generally, a second case is when a NAND cell/page permanently fails due to any type of unrecoverable circuit defects. Conventionally, for these reasons, SSD vendors always provide a fixed-size pool of replacement blocks (for example 1-2% of the total capacity) as spare blocks to replace "bad" blocks. Generally, once a SSD runs out of replacement blocks, the SSD is considered unusable or transitions to a read-only device. However, typically, even a read-only SSD must have spare blocks to manage retention policies.

Generally, the benefits of solid state drives are obvious; however, some of the drawbacks are not. Typically, one significant drawback with current solid state drive technology is durability of the medium. Traditionally, magnetic medium generally will support unlimited writes provided the physical components of the system remain operational. Typically, solid state drives have limited write capability. Conventionally, as a result, significantly more spare bad blocks are required to maintain the device over time. Typically, a solid state drive will have a fixed number of spare blocks that can be used to replace active blocks that become unusable. Conventionally, the number of spare blocks that are actually required and used over time is highly dependent on how the device is being used. Typically, if the user mainly uses the device for read-only data, then all of those spare blocks are essentially a wasted resource that the user paid for but is not using, nor available for the user to use in any way. Generally, if however the user is mostly performing writes to the device, then those spare blocks will eventually become needed. Typically, once all of the spare blocks have been used, the device will typically enter a read-only mode rendering it unusable by most people. Generally, spare blocks are pre-allocated by the manufacture and the host system has no visibility or knowledge of them.

In many embodiments, the current disclosure may enable a data storage system to prolong the life of an SSD by using free Host and/or Operating System (OS) allocated blocks as additional spare blocks for Bad Block Management (BBM). In various embodiments, the current disclosure may enable a SSD to extend its life by increasing the number of replaced Bad Blocks until the SSD gracefully wears-out. In certain embodiments, the current disclosure may enable a Host and/or OS to initialize an SSD. In some embodiments, the current disclosure may enable a host and/or OS to query an SSD to determine whether the SSD is enabled to support Host/OS allocated blocks for BBM.

In other embodiments, a Host and/or OS may be enabled to allocation one or more portions of a SSD for BBM. In most embodiments, a host and/or OS may be enabled to configure an SSD to request one or more NAND blocks to increase an SSD's ability to replace bad blocks on the SSD. In various embodiments, a host and/or OS may be enabled to set aside and/or communicate to an SSD a block of NAND blocks to be used by the SSD for bad block management. In many embodiments, memory may include NAND blocks and/or chips used by a SSD for data storage.

In most embodiments, a SSD may include an interface, SSD Memory Management module, and a plurality of NAND blocks to facilitate data storage on the SSD. In various embodiments, a Host and/or OS may be enabled to communicate with the SSD through an interface. In certain embodiments, an interface may enable a host and/or OS to communicate with a SSD Memory Management module and/or NAND blocks for data storage on the SSD. In some embodiments, a SSD may support utilizing host and/or OS allocated NAND blocks for bad block management on an SSD. In many embodiments, an interface on an SSD may be enabled to utilize vendor unique commands embedded within interface commands to support communication between a SSD Memory management module and a host and/or OS.

In various embodiments, a SSD Memory Management module may be enabled to provide information about the SSD to a host and/or OS. In certain embodiments, a SSD Memory management module may be enabled to provide information regarding an amount of total memory, number of bad blocks on an SSD, amount of replacement bad blocks available, and/or whether the SSD may be enabled to utilize Host and/or OS allocated NAND blocks for bad block management. In some embodiments, vendor unique commands may be embedded within one or more reserved bits and/or bytes within an interface command to/from a SSD.

Refer to the example embodiment of FIG. 1. FIG. 1 is a simplified illustration of a data storage system utilizing solid state drives for data storage, in accordance with an embodiment of the present disclosure. Data storage system 100 includes data management module 105 and internal Solid State Drive (SSD) 110. Data storage system 100 is enabled to communicate with external SSD 115. In this embodiment, data management module 105 is enabled facilitate bad block management in SSD 110 and SSD 115. Data management module 105 is enabled to query SSDs 110, 115 to determine whether SSDs 110, 115 are enabled to manage Host and/or OS allocated NAND blocks for bad block management within each respective SSD.

Figure 2:
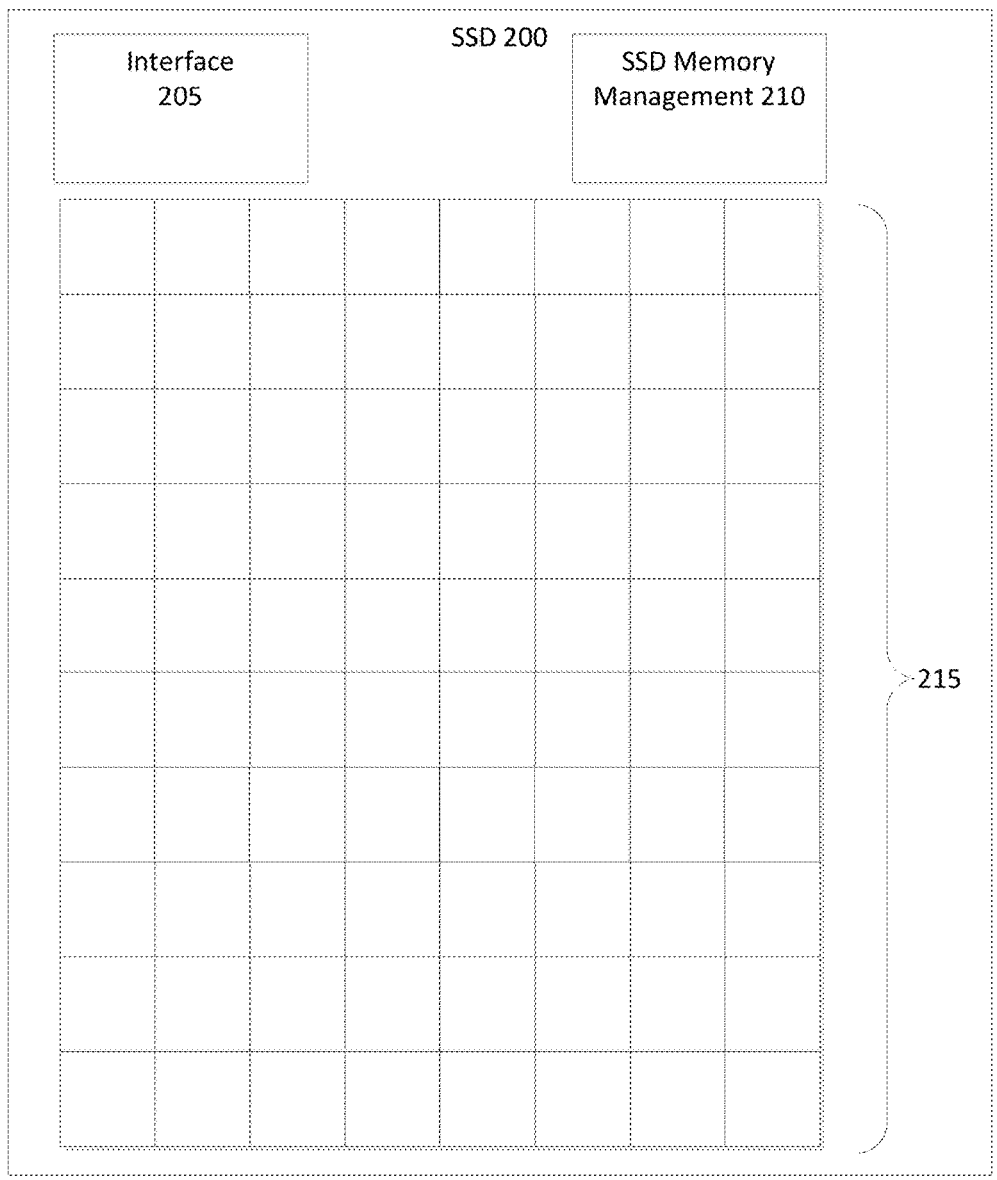
FIG. 2 is a simplified illustration of a solid state drive (SSD), in accordance with an embodiment of the present disclosure.

Refer to the example embodiment of FIG. 2. FIG. 2 is a simplified illustration of a solid state drive (SSD), in accordance with an embodiment of the present disclosure. SSD 200 includes interface 205, SSD Memory Management module 210, and a plurality of NAND blocks 215. Interface module 205 enables a host and/or OS to communicate with SSD 200. Specifically, Interface module 205 enables a host and/or OS to communicate with either the SSD Memory Management module 210 and the plurality of NAND blocks 215.

Figure 3A:
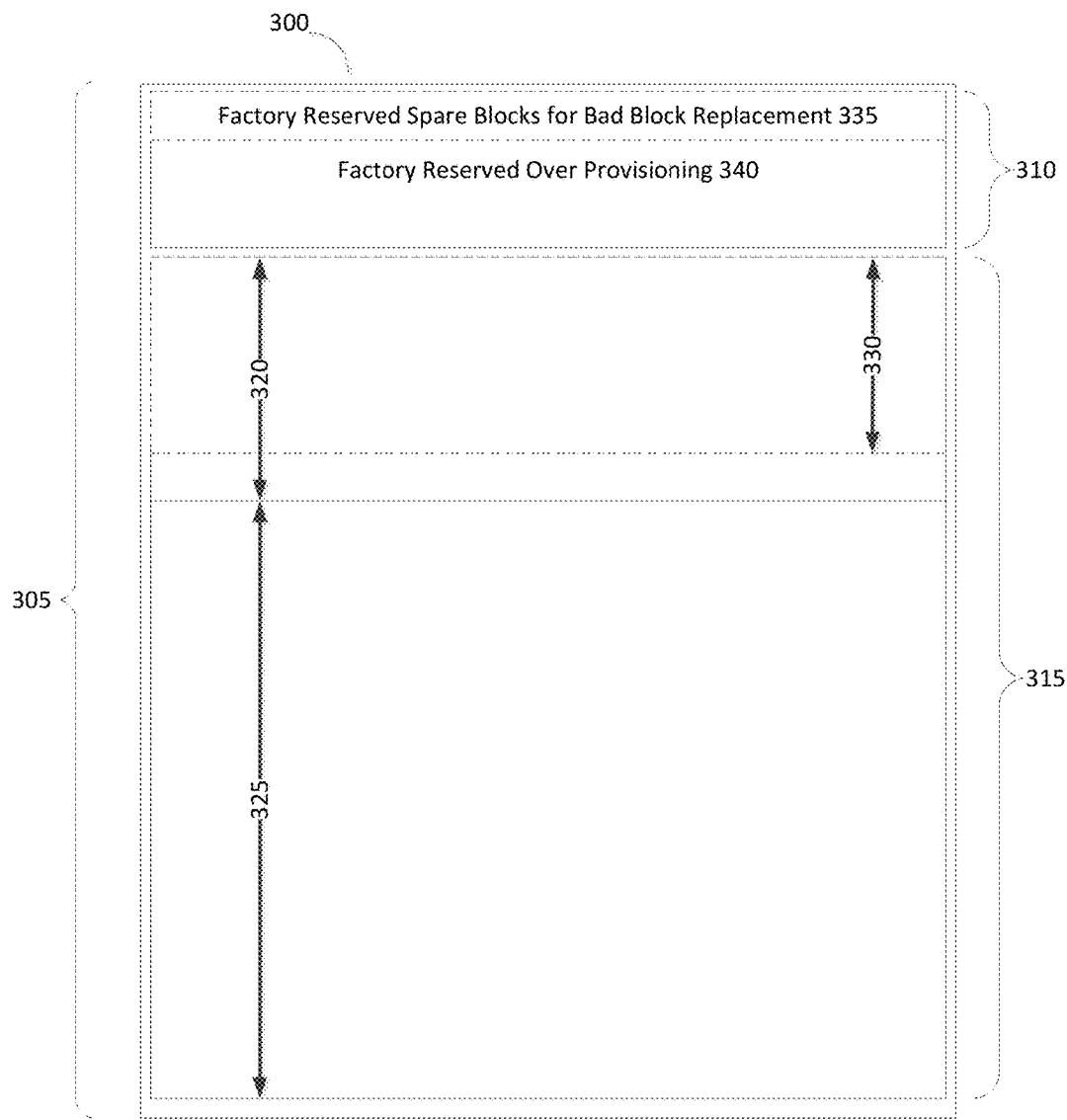
FIG. 3A is a simplified illustration of allocation of NAND blocks within a Solid State Drive (SSD), in accordance with an embodiment of the present disclosure.
Figure 3B:
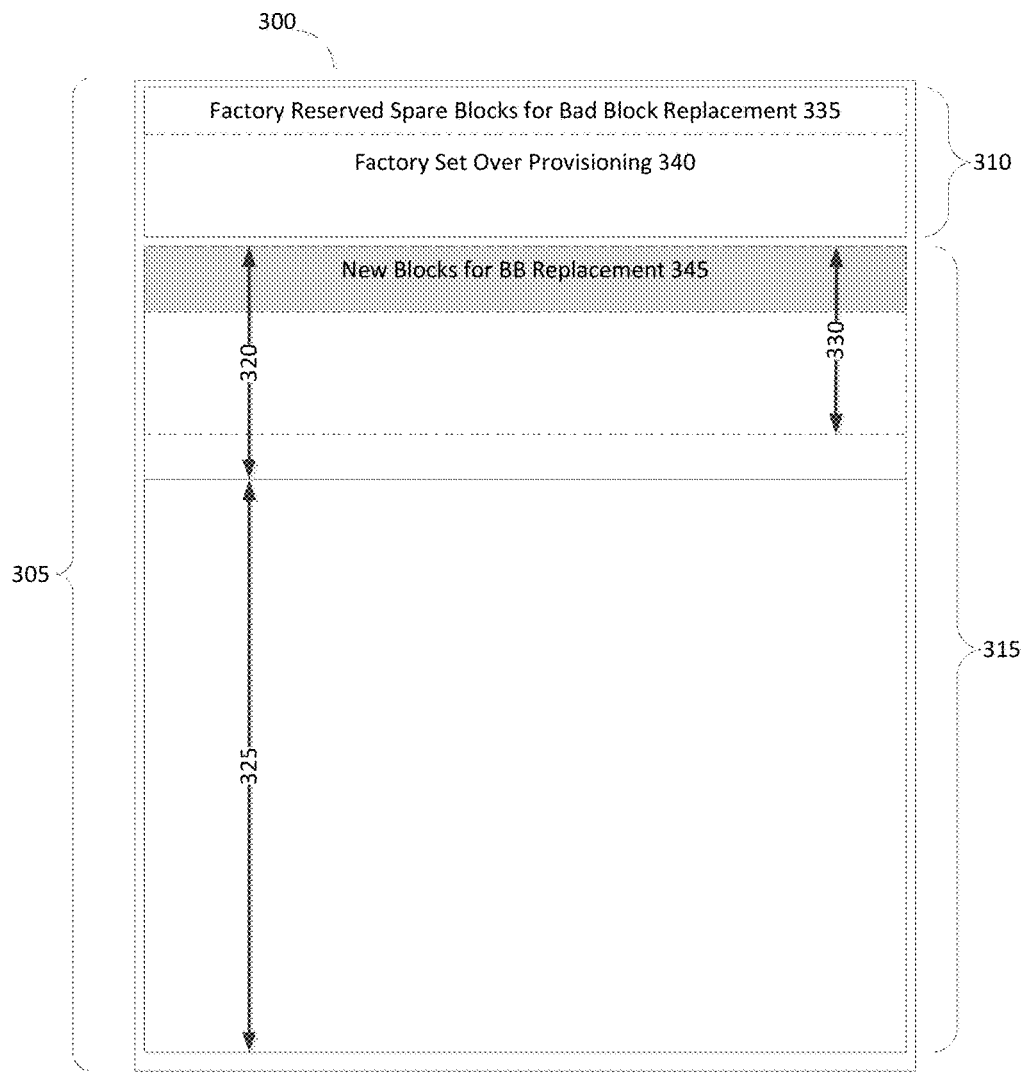
FIG. 3B is an alternate simplified illustration of an allocation of NAND blocks within a Solid State Drive (SSD), in accordance with an embodiment of the present disclosure.

Refer to the example FIGS. 3A and 3B. FIG. 3A is a simplified illustration of allocation of NAND blocks within a Solid State Drive (SSD), in accordance with an embodiment of the present disclosure. Shown in FIG. 3A are NAND blocks within SSD 300. Bracket 305 indicates the total physical capacity of SSD 300. The total physical capacity of SSD 300 is divided into two portions of NAND blocks. SSD 300 is divided into a Factory Reserve portion 310 and Operating System (OS) allocated capacity 315. Factory reserved portion 310 generally includes factory reserved spare blocks for bad block replacement (FRBBM) 335 and Factory Reserved Over Provisioning (FROP) 340. Both FRBBM 335 and FROP 340 represent portions of the total physical capacity of the NAND blocks of SSD 300 set aside by the manufacturer of SSD 300 for bad block replacement and over provisioning. Arrow 325 represents an amount of used blocks of memory be a HOST and/or OS utilizing SSD 300. Arrow 320 represents an amount of free blocks of memory available to a Host and/or OS utilizing SSD 300. Arrow 330 represents a dynamic amount of NAND blocks that is enabled to be used for over provisioning. The NAND blocks from FROP 340 and indicated by arrow 330 may be used for over provisioning SSD 300 to provide data storage for a user and/or OS utilizing SSD 300.

FIG. 3B is an alternate simplified illustration of an allocation of NAND blocks within a Solid State Drive (SSD), in accordance with an embodiment of the present disclosure. Shown in FIG. 3B are NAND blocks within SSD 300. Bracket 305 indicates the total physical capacity of SSD 300. The total physical capacity of SSD 300 is divided into two portions of NAND blocks. The difference between FIGS. 3A and 3B, is that FIG. 3B shows a portion of OS allocated capacity 315 being allocated for New Blocks for Bad Block Replacement (NBBBR) 345. In this embodiment, SSD 300 is enabled to utilize NBBBR 345 to supplement FRBBM 335 when replacing bad blocks in OS Allocated capacity 315. SSD 300 utilizing NBBBR 345 and FRBBM 335 enables SSD 300 to lengthen the life of SSD 300.

Figure 4A:
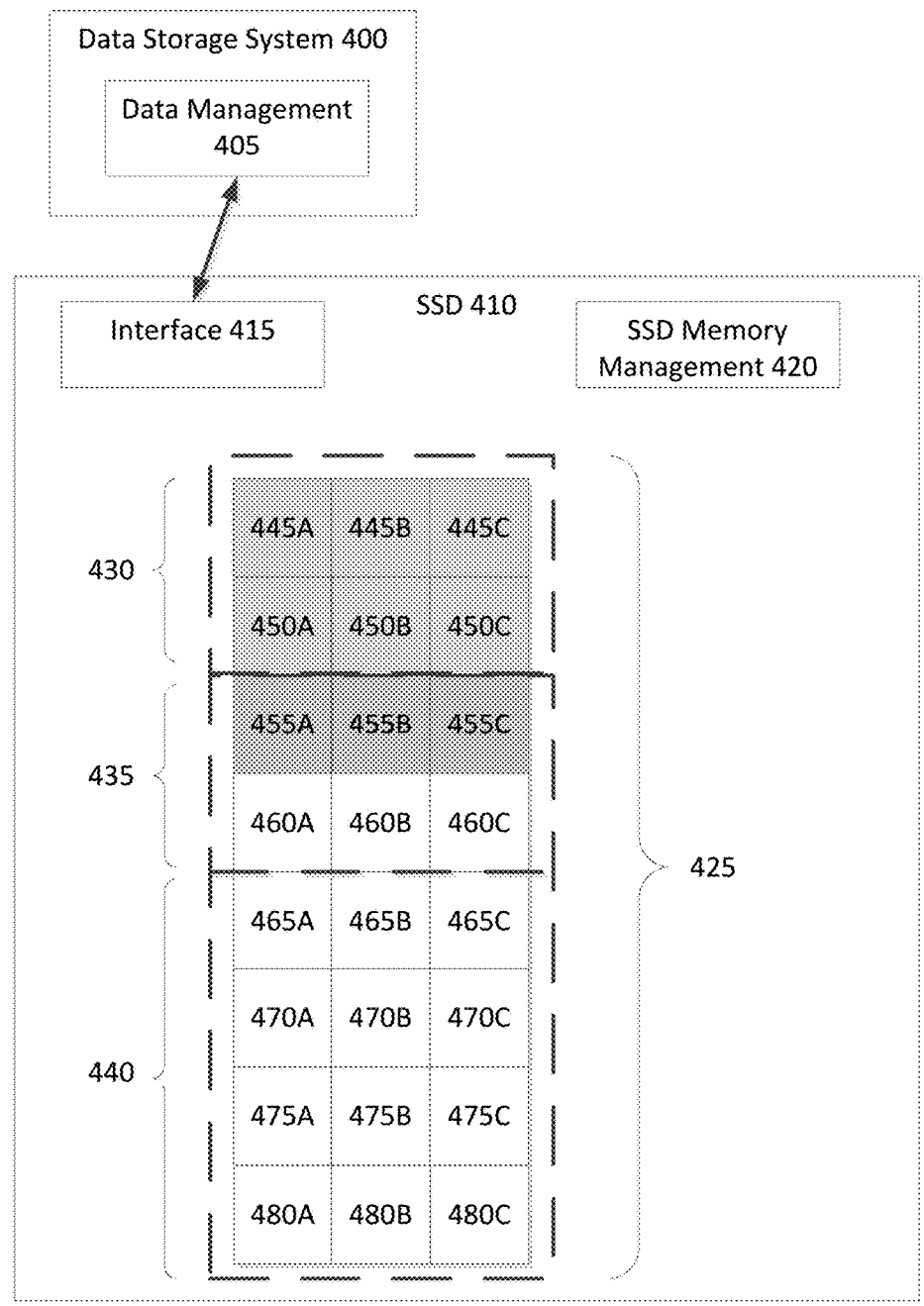
FIG. 4A is a simplified illustration of a first state of a data storage system managing a solid state drive (SSD), in accordance with an embodiment of the present disclosure.
Figure 4B:
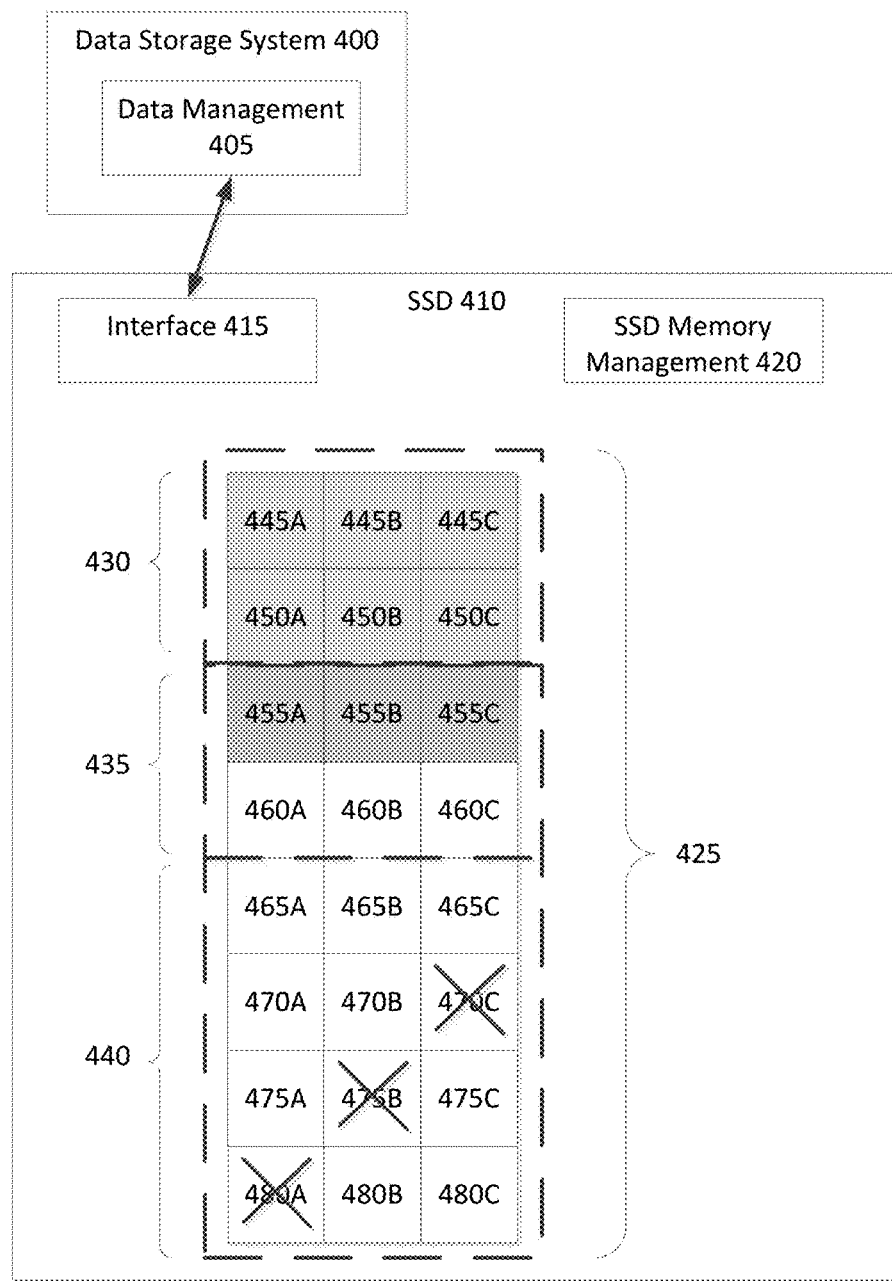
FIG. 4B is a simplified illustration of a second state of a data storage system managing a solid state drive (SSD), in accordance with an embodiment of the present disclosure.
Figure 4C:
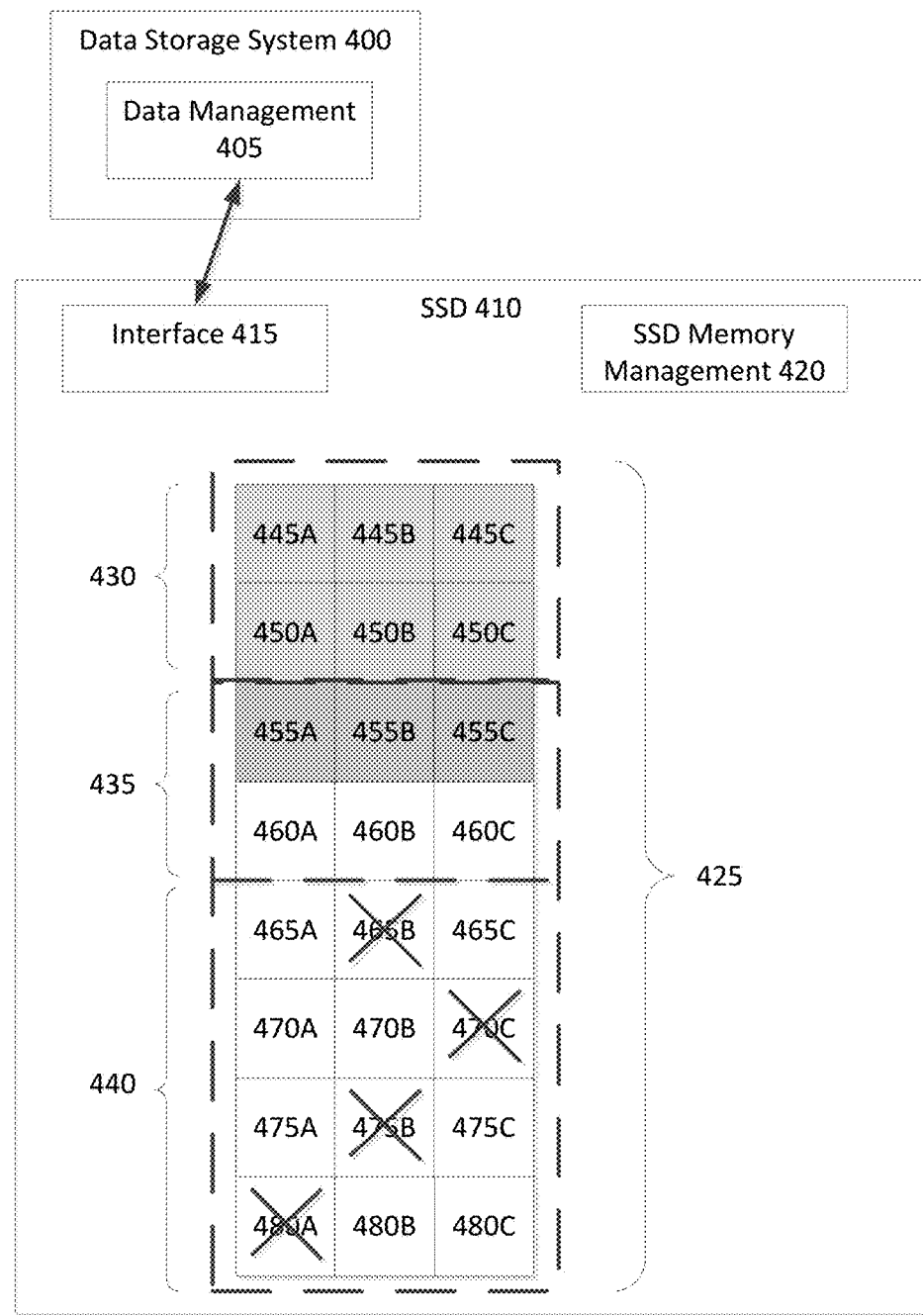
FIG. 4C is a simplified illustration of a third state of a data storage system managing a solid state drive (SSD), in accordance with an embodiment of the present disclosure.

Refer to the example embodiments of FIGS. 4A-4C. FIG. 4A is a simplified illustration of a first state of a data storage system managing a solid state drive (SSD), in accordance with an embodiment of the present disclosure. SSD 410 includes interface module 415, SSD Memory Management module 420, and NAND blocks (425). In this embodiment, NAND blocks 425 are divided into three portions. Portion 430 is a Factory reserved portion which includes NAND blocks 445A-C and NAND blocks 450A-C. Portion 435 and Portion 440 comprise Operating system (OS) allocated capacity. In this embodiment, Portion 440 are used NAND blocks by a Host and/or OS utilizing SSD 410. Portion 435 is an amount of free NAND blocks available to a Host and/or OS utilizing SSD 410.

In this embodiment, NAND Blocks (445A-C, 445 generally) are factory reserved spare blocks for bad block replacement (FRBBM) (445). NAND Blocks (450A-C, 450 Generally) are Factory Reserved Over Provisioning (FROP) (340). NAND Blocks (455A-C, 455 generally) are host and/or OS allocated NAND blocks to facilitate bad black management within SSD 410. Interface module 415 enables data storage system 400 to communicate with SSD 410. Specifically, Data management module 405 manages SSD 410 through interface 415. Data management module 405 is enabled to communicate with portion 435, portion 440, and SSD Memory management module 420.

As shown, SSD Memory management module 420 is enabled to manage NAND blocks 425 on SSD 410. SSD Memory management module 420 is enabled to read, write, modify each of NAND blocks 425. In this embodiment, SSD Memory Management module 420 is enabled to use FRBBM 445 to replace bad NAND blocks on SSD 410.

In this embodiment, data management module 405 is enabled to query SSD memory management module 420 through interface 415 to determine whether SSD 410 is enabled to allow data management module 405 to supplement FRBBM 445 with supplemental NAND blocks from portion 440 or portion 435. In many embodiments, a SSD Memory management module may be enabled to request OS and/or Host managed replacement blocks on an as needed basis. In various embodiments, a SSD Memory management module may be enabled to request a plurality of OS and/or Host managed replacement blocks to replace bad blocks in an SSD. In most embodiments, while replacement blocks in FIGS. 4A-C are shown as contiguous, blocks allocated by a host and/or OS in communication with a SSD may be from contiguous and/or non-contiguous chunks of NAND blocks from the SSD.

FIG. 4B is a simplified illustration of a second state of a data storage system managing a solid state drive (SSD), in accordance with an embodiment of the present disclosure. SSD 410 includes interface 415, SSD Memory Management 420, and NAND Blocks 425. Data storage system 400 utilizes data management module 405 to communicate with SSD 410 through interface 415. In this embodiment, NAND blocks 480A, 475B, and 470C have gone bad and need to be replaced. SSD Memory Management 420 determines that NAND blocks 480A, 475B, and 470C are bad and replace the bad blocks with NAND blocks 445A, 445B, and 445C. Data management module 405, in management of NAND blocks 425, have set aside NAND blocks (455A-C, 455 Generally) to supplement FRBBM 445. In this embodiment, if another NAND block goes bad, SSD Memory Management module 420 would not have any other NAND blocks to use as a replacement block as FRBBM 445 are all taken by bad blocks 480A, 475B, and 470C.

FIG. 4C is a simplified illustration of a third state of a data storage system managing a solid state drive (SSD), in accordance with an embodiment of the present disclosure. In this state, Nand Blocks 480A, 475B, 470C, and 465B have gone bad. SSD Memory Management 420 is enabled to use FRBBM 445 to replace three of the bad blocks. However, SSD Memory Management 420 does not have any extra NAND blocks to replace the fourth bad black of NAND Blocks 480A, 475B, 470C, and 465B. SSD Memory Management module 420 is enabled to request a host and/or OS allocated replacement block from NAND Blocks (455A-C, 455 Generally). In many embodiments, a SSD Memory Management module may be enabled to request OS and/or Host allocated replacement blocks on an as needed basis. In various embodiments, a SSD Memory Management module may be enabled to request for a block of OS and/or Host allocated replacement blocks (i.e. chunks of NAND blocks for replacement, more than one at a time) to use on an as needed basis.

Figure 5:
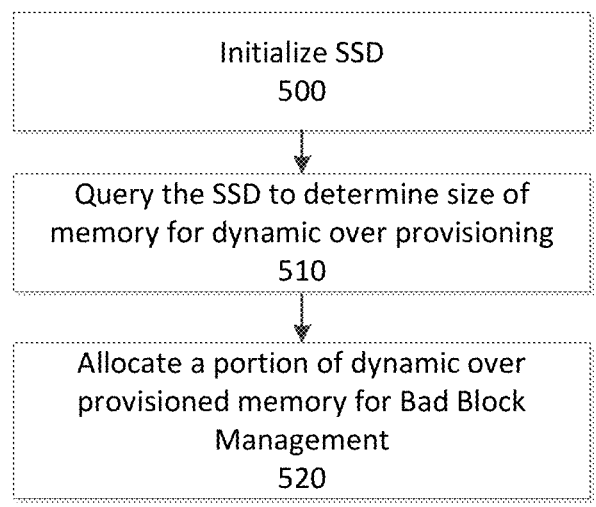
FIG. 5 is a simplified flowchart of a method of initializing a Solid State Drive (SSD) as shown in FIGS. 4A-C, in accordance with an embodiment of the present disclosure.

Refer to the example embodiments of FIG. 5. FIG. 5 is a simplified flowchart of a method of initializing a Solid State Drive (SSD) as shown in FIGS. 4A-C, in accordance with an embodiment of the present disclosure. FIGS. 4A-C show data storage system 400 in communication with SSD 410. SSD 410 includes interface module 415, SSD Memory Management module 420, and NAND blocks (425). Data storage system 400 includes data management module 405. Data storage system 400 utilizes data management module 405 to initialize SSD 410 (Step 500). Data management module 405 communicates to SSD 410 through interface module 415. Data management module 405 queries SSD Memory Management module 420, using interface 415, to determine the size of memory for dynamic provisioning (Step 510). Data management module 405 determines that portion 435 is available for dynamic over provisioning of memory and allocates NAND blocks (455) for bad block management.

Figure 6:
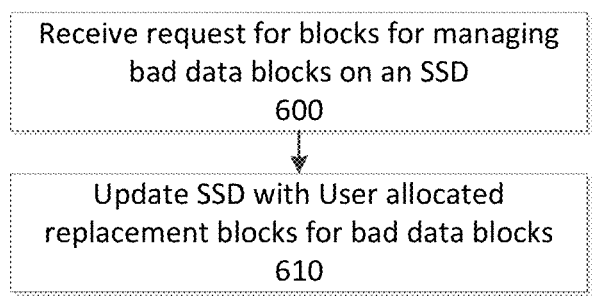
FIG. 6 is a simplified flowchart of a method of retrieving user allocated replacement blocks for a Solid State Drive (SSD) as shown in FIGS. 4A-C, in accordance with an embodiment of the present disclosure.

Refer to the example embodiments of FIG. 6. FIG. 6 is a simplified flowchart of a method of retrieving user allocated replacement blocks for a Solid State Drive (SSD) as shown in FIGS. 4A-C, in accordance with an embodiment of the present disclosure. FIGS. 4A-C show data storage system 400 in communication with SSD 410. SSD 410 includes interface module 415, SSD Memory Management module 420, and NAND blocks (425). Data storage system 400 includes data management module 405. SSD Memory Management 420 detects the existence of bad blocks within NAND blocks 425. SSD Memory Management module 420 determines that there are four bad blocks (as shown in FIG. 4C) and determines that FRBBM 445 does not include enough blocks to replace NAND blocks 480A, 475B, 470C, and 465B. SSD Memory Management module 420 sends a request to Data Management module 405 for any user allocated NAND blocks of NAND blocks 425 that can be used for bad block replacement. Data management module 405 receives a request for blocks for management bad data blocks on SSD 410 (Step 600). Data management module 405 determines that NAND Blocks 455 were allocated to be replacement blocks if needed. Data management module 405 updates SSD Memory Management 420 with the information that NAND Block 455A can be used to replace a bad data block (Step 610).

Figure 7:
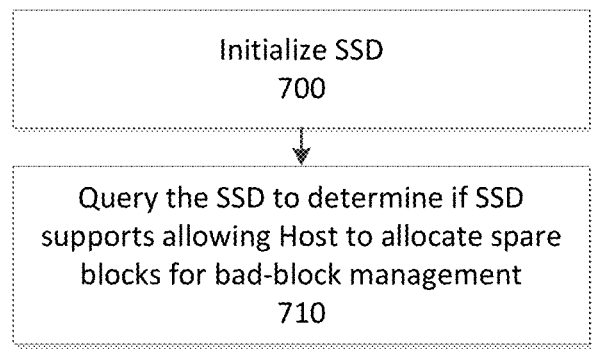
FIG. 7 is a simplified flowchart of a method of initializing a Solid State Drive (SSD) as shown in FIGS. 4A-C, in accordance with an embodiment of the present disclosure.

Refer to the example embodiments of FIG. 7. FIG. 7 is a simplified flowchart of a method of initializing a Solid State Drive (SSD) as shown in FIGS. 4A-C, in accordance with an embodiment of the present disclosure. FIGS. 4A-C show data storage system 400 in communication with SSD 410. SSD 410 includes interface module 415, SSD Memory Management module 420, and NAND blocks (425). Data storage system 400 includes data management module 405. Data storage system 400 directs data management module 405 to initialize SSD 410 (Step 700). SSD 410 receives an initialization requests and initializes NAND Blocks 425 on SSD 410. Data management module 405 queries SSD 410 to determine if SSD 410 supports allowing data storage system 400 to allocate spare blocks for bad block management (Step 710). SSD Memory Management module 420 receives the query from data management module 405 through interface 415. SSD Memory Management module 420 responds that SSD 410 allows a host and/or OS to allocate one or more NAND blocks of portion 435 or portion 440 for use as replacement blocks to supplement SSD Memory Management module's use of FRBBM 445.

General

The methods and apparatus of this invention may take the form, at least partially, of program code (i.e., instructions) embodied in tangible non-transitory media, such as floppy diskettes, CD-ROMs, hard drives, random access or read only-memory, or any other machine-readable storage medium.

Figure 8:
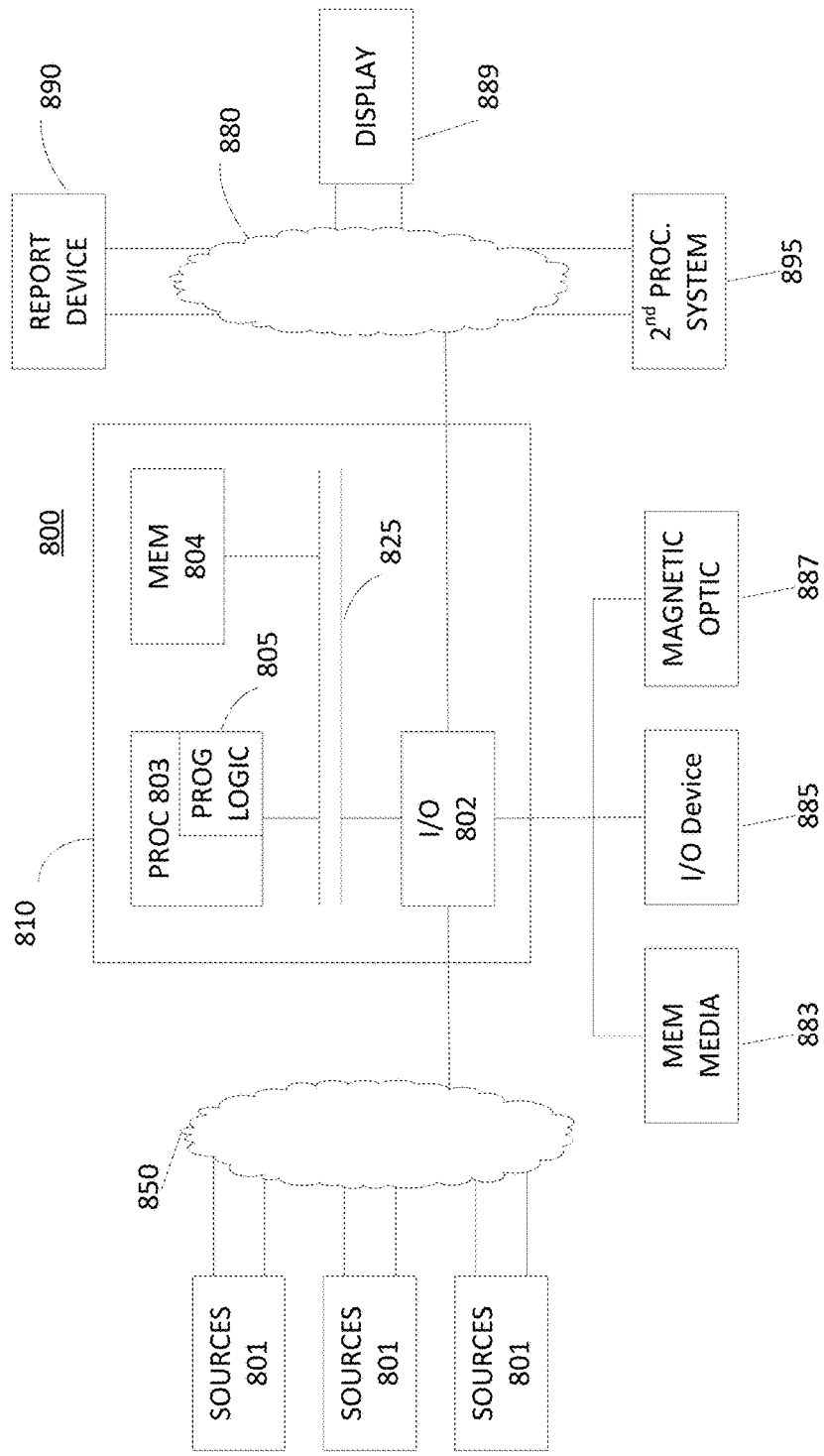
FIG. 8 is an example of an embodiment of an apparatus that may utilize the techniques described herein, in accordance with an embodiment of the present disclosure.

FIG. 8 is a block diagram illustrating an apparatus, such as a computer 810 in a network 800, which may utilize the techniques described herein according to an example embodiment of the present invention. The computer 810 may include one or more I/O ports 802, a processor 803, and memory 804, all of which may be connected by an interconnect 825, such as a bus. Processor 803 may include program logic 805. The I/O port 802 may provide connectivity to memory media 883, I/O devices 885, and drives 887, such as magnetic drives, optical drives, or Solid State Drives (SSD). When the program code is loaded into memory 804 and executed by the computer 810, the machine becomes an apparatus for practicing the invention. When implemented on one or more general-purpose processors 803, the program code combines with such a processor to provide a unique apparatus that operates analogously to specific logic circuits. As such, a general purpose digital machine can be transformed into a special purpose digital machine.

Figure 9:
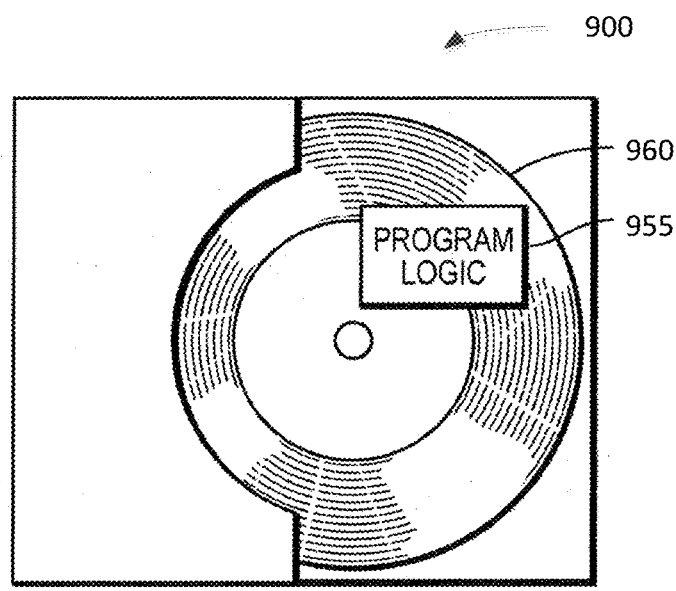
FIG. 9 is an example of a method embodied on a computer readable storage medium that may utilize the techniques described herein, in accordance with an embodiment of the present disclosure.

FIG. 9 is a block diagram illustrating a method embodied on a computer readable storage medium 960 that may utilize the techniques described herein according to an example embodiment of the present invention. FIG. 9 shows Program Logic 955 embodied on a computer-readable medium 960 as shown, and wherein the Logic is encoded in computer-executable code configured for carrying out the methods of this invention and thereby forming a Computer Program Product 900. Program Logic 955 may be the same logic 805 on memory 804 loaded on processor 803 in FIG. 8. The program logic may be embodied in software modules, as modules, as hardware modules, or on virtual machines.

The logic for carrying out the method may be embodied as part of the aforementioned system, which is useful for carrying out a method described with reference to embodiments shown in, for example, FIGS. 1-9. For purposes of illustrating the present invention, the invention is described as embodied in a specific configuration and using special logical arrangements, but one skilled in the art will appreciate that the device is not limited to the specific configuration but rather only by the claims included with this specification.

Although the foregoing invention has been described in some detail for purposes of clarity of understanding, it will be apparent that certain changes and modifications may be practiced within the scope of the appended claims. Accordingly, the present implementations are to be considered as illustrative and not restrictive, and the invention is not to be limited to the details given herein, but may be modified within the scope and equivalents of the appended claims.

What is claimed is:

1. A computer-executable method of managing a solid state drive (SSD) in a data storage system, the computer-executable method comprising:
    initializing the SSD to enable the SSD to request memory for bad block replacement;
    querying the SSD to determine a size of memory on the SSD reserved for dynamic over provisioning; and
    allocating a portion of the size of memory for bad block replacement.

2. The computer-executable method of claim 1, further comprising:
    upon receiving a request from the SSD for memory for bad block replacement, notifying the SSD of the allocated portion.

3. The computer-executable method of claim 2, wherein the SSD reserves all of the portion for bad block replacement.

4. The computer-executable method of claim 2, wherein the SSD reserves a block of the portion for bad block replacement.

5. The computer-executable method of claim 1, wherein initializing comprises:
    notifying the SSD that the data storage system is enabled to dynamically allocate spare blocks;
    determining how memory is allocated on the SSD.

* * * * *